(12) United States Patent
Chen

(10) Patent No.: US 7,807,564 B2
(45) Date of Patent: *Oct. 5, 2010

(54) METHOD AND STRUCTURE FOR LOW-K INTERLAYER DIELECTRIC LAYER

(75) Inventor: Guoqing Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/218,356

(22) Filed: Jul. 11, 2008

(65) Prior Publication Data
US 2008/0274609 A1    Nov. 6, 2008

Related U.S. Application Data

(62) Division of application No. 10/927,828, filed on Aug. 27, 2004, now Pat. No. 7,507,656.

(30) Foreign Application Priority Data
Jun. 2, 2004    (CN)    ........................ 2004 1 0024966

(51) Int. Cl.
*H01L 21/4763* (2006.01)
(52) U.S. Cl. ........................ 438/619; 438/624; 438/637; 257/E21.581
(58) Field of Classification Search ................. 438/619
See application file for complete search history.

(56) References Cited
U.S. PATENT DOCUMENTS 5,286,667 A * 2/1994 Lin et al. ..................... 438/253
5,413,962 A   5/1995 Lur et al.
6,245,658 B1  6/2001 Buynoski (Continued)

FOREIGN PATENT DOCUMENTS

WO    02/103791 A2    12/2002

(Continued)

OTHER PUBLICATIONS

Aoi et al., "Evaluation and Analysis for Mechanical Strengths of Low K dielectrics by a finite Element Method." Proceedings of the IEEE 2002, pp. 72-74.

(Continued)

*Primary Examiner*—Stephen W Smoot
(74) *Attorney, Agent, or Firm*—Townsend and Townsend and Crew LLP

(57) ABSTRACT

An integrated circuit interconnect structure. The structure includes a substrate and a layer of transistor elements overlying the substrate. A first interlayer dielectric layer is formed overlying the layer of transistor elements. An etch stop layer is formed overlying the first interlayer dielectric layer. A contact structure including metallization is within the first interlayer dielectric layer and a metal layer is coupled to the contact structure. A passivation layer is formed overlying the metal layer. Preferably, an air gap layer is coupled between the passivation layer and the metal layer, the air gap layer allowing a portion of the metal layer to be free standing. Depending upon the embodiment, a portion of the air gap layer may be filled with silicon bearing nanoparticles, which may be oxidized at low temperatures. This oxidized layer provides mechanical support and low k dielectric characteristics. Preferably, a portion of the air gap layer is filled with a low k dielectric material as well.

6 Claims, 4 Drawing Sheets

U.S. PATENT DOCUMENTS

| | | | |
|---|---|---|---|
| 6,713,835 | B1 | 3/2004 | Horak et al. |
| 6,984,892 | B2 | 1/2006 | Gotkis et al. |
| 7,507,656 | B2 * | 3/2009 | Chen .......................... 438/619 |
| 2002/0160563 | A1 | 10/2002 | Ghoshal |

OTHER PUBLICATIONS

Nozaki et al., "Ultralow K Nanoporous Silica by Oxidation of Silicon Nanoparticles." Proceedings of the IEEE 2002, pp. 69-71.

Requirement for Restriction/Election for U.S. Appl. No. 10/927,828, mailed on Jun. 22, 2006, 5 pages.

Non-Final Office Action for U.S. Appl. No. 10/927,828, mailed on Aug. 16, 2006, 11 pages.

Final Office Action for U.S. Appl. No. 10/927,828, mailed on Jun. 21, 2007, 12 pages.

Non-Final Office Action for U.S. Appl. No. 10/927,828, mailed on Jun. 9, 2008, 12 pages.

Notice of Allowance for U.S. Appl. No. 10/927,828, mailed on Nov. 6, 2008, 8 pages.

* cited by examiner

METHOD AND STRUCTURE FOR LOW-K INTERLAYER DIELECTRIC LAYER

BACKGROUND OF THE INVENTION

This application claims benefit to Chinese Patent Application No. 200410024966.5, filed on Jun. 2, 2004, and is incorporated herein by this reference.

BACKGROUND OF THE INVENTION

The present invention is directed to integrated circuits and their processing for the manufacture of semiconductor devices. More particularly, the invention provides a method for manufacturing an interconnect structure having low k dielectric characteristics for advanced integrated circuits such as microprocessors, application specific integrated circuits, memories, mixed signal applications, and the like. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of interconnect structures using low k dielectric materials. These low k dielectric materials include, among others, Black Diamond™ by Applied Materials, Inc. Other low k materials include those known as HSQ, FSG, and SiLK from Dow Chemical Company. Unfortunately, many of these dielectric materials have limitations. As merely an example, these materials have poor etching characteristics. Additionally, these materials must often be planarized using chemical mechanical planarization, wet cleaning processes, or other like techniques. These polishing and cleaning techniques often cause damage to the low k materials. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method for manufacturing an interconnect structure having low k dielectric characteristics for advanced integrated circuits such as microprocessors, application specific integrated circuits, memories, mixed signal applications, and the like. But it would be recognized that the invention has a much broader range of applicability.

In a specific embodiment, the invention provides a method for forming a low K dielectric layer, e.g., k<2.0, 3.9. The method includes providing a substrate, e.g., silicon wafer. The method includes forming a layer of transistor elements (e.g., MOS transistors) overlying the substrate and forming a first interlayer dielectric layer (e.g., BPSG, TEOS) overlying the layer of transistor elements. The method includes forming an etch stop layer (e.g., silicon nitride) overlying the first interlayer dielectric layer and patterning the first interlayer dielectric layer to form a contact structure. A step of filling the contact structure with metallization (e.g., aluminum, copper, tungsten) is included. The method also includes forming a thickness of sacrificial layer overlying the contact structure and overlying etch stop layer and forming a metal layer overlying the thickness of sacrificial layer. The metal layer is coupled to the contact structure. Additionally, the method includes forming one or more other layers overlying the metal layer. A step of selectively removing the thickness of sacrificial layer while maintaining the metal layer and etch stop layer intact to form an air gap between a portion of the etch stop layer and the one or more other layers is also included.

In an alternative specific embodiment, the invention provides an alternative method for forming a low K dielectric layer. The method includes providing a substrate and forming a layer of transistor elements overlying the substrate. The method also includes forming a first interlayer dielectric layer overlying the layer of transistor elements and forming an etch stop layer overlying the first interlayer dielectric layer. The method includes patterning the first interlayer dielectric layer to form a contact structure and filling the contact structure with metallization. A step of forming a thickness of sacrificial layer overlying the contact structure is included. The method forms a metal layer overlying the thickness of sacrificial layer, the metal layer being coupled to the contact structure and forms one or more other layers overlying the metal layer. The method selectively removes the thickness of sacrificial layer while maintaining the metal layer and etch stop layer intact to form an air gap between a portion of the etch stop layer and the one or more other layers. A passivation layer is formed overlying the metal layer.

In yet an alternative embodiment, the invention provides an integrated circuit interconnect structure. The structure includes a substrate and a layer of transistor elements overlying the substrate. A first interlayer dielectric layer is formed overlying the layer of transistor elements. An etch stop layer is formed overlying the first interlayer dielectric layer. A contact structure including metallization is within the first interlayer dielectric layer and a metal layer is coupled to the contact structure. A passivation layer is formed overlying the metal layer. Preferably, an air gap layer is coupled between the passivation layer and the metal layer, the air gap layer allowing a portion of the metal layer to be free standing. Depending upon the embodiment, a portion of the air gap layer may be filled with silicon bearing nanoparticles, which may be oxidized at low temperatures. This oxidized layer provides mechanical support and low k dielectric characteristics.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved low k dielectric structure that is free from limitations associated with conventional low k dielectric materials. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method for manufacturing an interconnect structure having low k dielectric characteristics for advanced integrated circuits such as microprocessors, application specific integrated circuits, memories, mixed signal applications, and the like. But it would be recognized that the invention has a much broader range of applicability.

A method for fabricating an interconnect structure according to an embodiment of the present invention may be outlined as follows:

1. Provide a substrate;
2. Form a layer of transistor elements overlying the substrate;
3. Form a first interlayer dielectric layer overlying the layer of transistor elements;
4. Form an etch stop layer overlying the first interlayer dielectric layer;
5. Pattern the first interlayer dielectric layer to form a contact structure;
6. Fill the contact structure with metallization;
7. Form a thickness of sacrificial layer overlying the contact structure and overlying etch stop layer;
8. Form a metal layer overlying the thickness of sacrificial layer, the metal layer being coupled to the contact structure;
9. Form one or more other layers overlying the metal layer; and
10. Selectively remove the thickness of sacrificial layer while maintaining the metal layer and etch stop layer intact to form an air gap between a portion of the etch stop layer and the one or more other layers; and
11. Perform other steps, as desired.

The above sequence of steps provides a method according to an embodiment of the present invention. As shown, the method uses a combination of steps including a way of forming an interconnect structure having a low k dielectric layer. Other alternatives can also be provided where steps are added, one or more steps are removed, or one or more steps are provided in a different sequence without departing from the scope of the claims herein. Further details of the present method can be found throughout the present specification and more particularly below.

Figure 1:
FIGS. 1 through 8 illustrate a method for forming an interconnect structure according to an embodiment of the present invention
Figure 2:
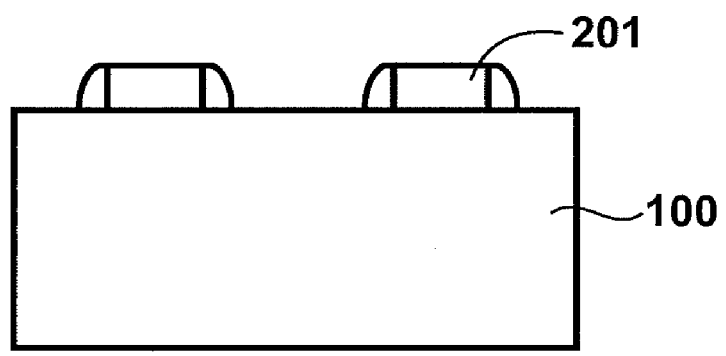
Figure 3:
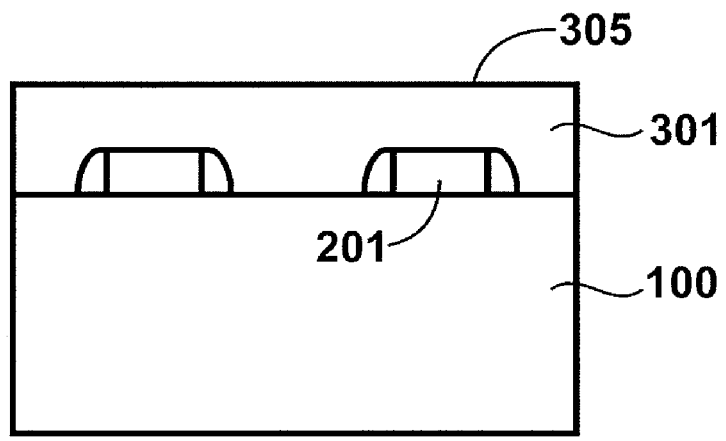

FIGS. 1 through 7 illustrate a method for forming an interconnect structure according to an embodiment of the present invention. These diagrams are merely examples, which should not unduly limit the scope of the claims herein. One of ordinary skill in the art would recognize many variations, alternatives, and modifications. As shown, the method begins by providing a substrate 100, e.g., silicon wafer, silicon on insulator, epitaxial wafer. The method includes forming a layer of transistor elements 201 overlying the substrate. The transistor elements are MOS transistors or other like elements, as illustrated by FIG. 2. The method also includes forming a first interlayer dielectric layer 301 overlying the layer of transistor elements. The interlayer dielectric layer has an upper surface, which may be planarized. The dielectric layer is made of a materials such as CVD oxide, BPSG, PE-TEOS, PSG, and Spin-On-Glass.

Figure 4:
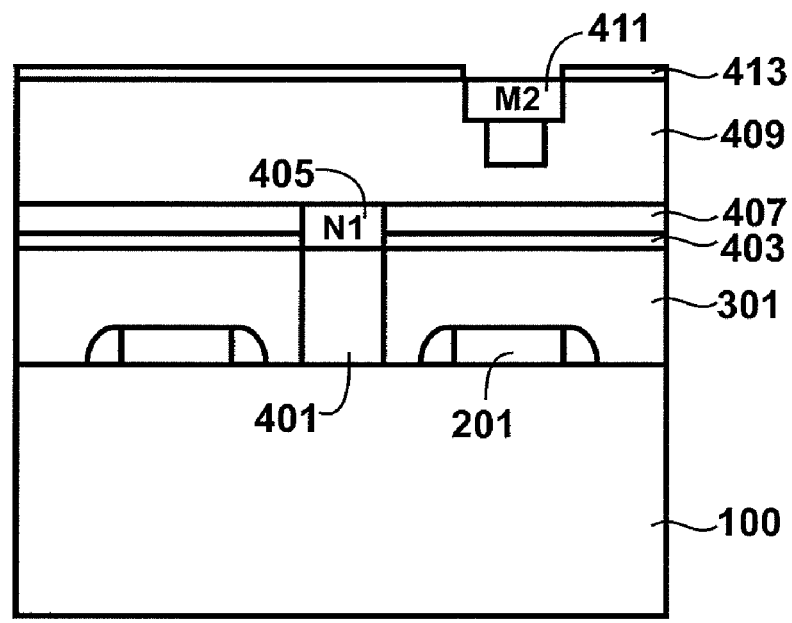
Figure 5:
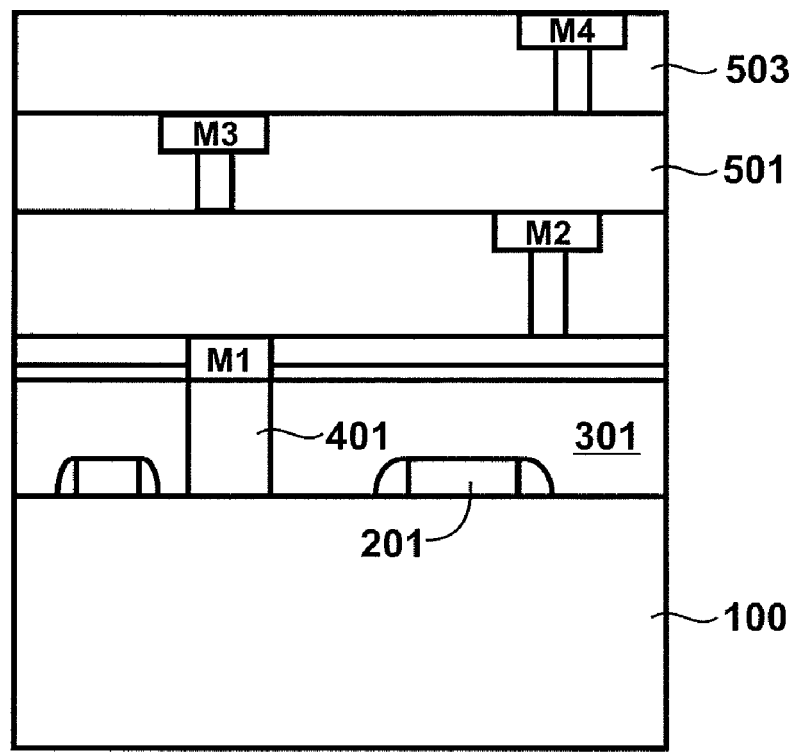

Referring to FIG. 4, the method includes forming an etch stop layer 403 overlying the surface of the first interlayer dielectric layer. The etch stop layer has certain selectively relative to the interlayer dielectric layer. The etch stop layer can be made of a silicon oxynitride, aluminum oxide and the like. The method includes patterning the first interlayer dielectric layer and etch stop layer to form a contact structure 401. The contact structure is filled with metallization, e.g., tungsten, doped polysilicon, titanium, titanium nitride, and others. The method also forms a first sacrificial layer 407, which is patterned for metal 1 layer 405. A second sacrificial layer 409 is formed overlying the first sacrificial layer. The second sacrificial layer is patterned for metal 2 411. Overlying the second sacrificial layer may be an etch stop layer. Depending upon the application, the method forms one or more other layers overlying the metal 1 and 2 layers. Of course, there may be alternatives, modifications, and variations. Referring to FIG. 5, the method forms other sacrificial layers and metal layers. As shown, sacrificial layer 501 includes metal 2 layer. Sacrificial layer 503 includes metal 4 layer. Each of these metal layers includes a metal layer and plug structure, which form an interconnect structure. The sacrificial layer can be made of a suitable material that can be selectively removed. As merely an example, the sacrificial layer can be made of BPSG, CVD oxide, PE-TEOS, or other CVD oxides.

Figure 6:
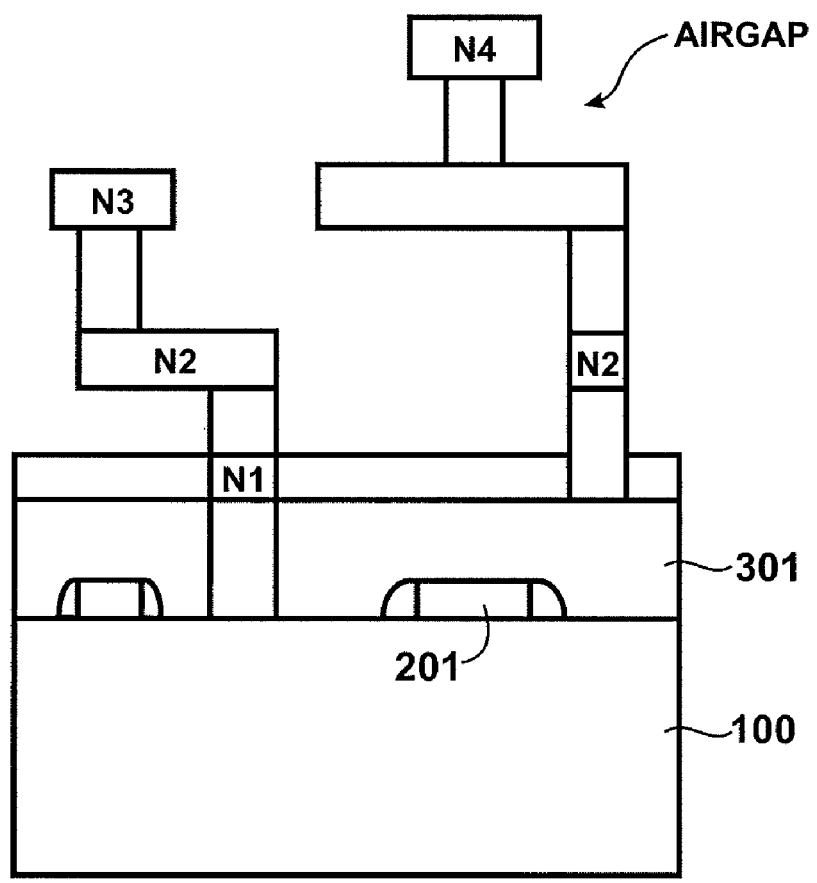

Referring to FIG. 6, the method selectively removes the thickness of sacrificial layer or layers while maintaining the metal layer and etch stop layer intact. Such selective removal forms an air gap between a portion of the etch stop layer and the one or more other layers. Preferably, the selective removal forms a free standing interconnect structure that is supported by the interconnects themselves. Depending upon the application, wet or dry processing chemistries may be used. Wet chemistries include, among others, buffered oxide etch, commonly called BOE, TMAF/HF mixture, and other like solutions. These solutions also do not remove copper metal layers. Other chemistries include vapor phase HF, which selectively removes oxides and does not damage aluminum. Alternatively, the interconnect structure can be partially supported by selected remaining portions of one or more of the sacrificial layers, which have not been selectively removed. As shown, the air gap structure forms a very low dielectric constant between each of the metal layers, which is desirable.

Figure 7:
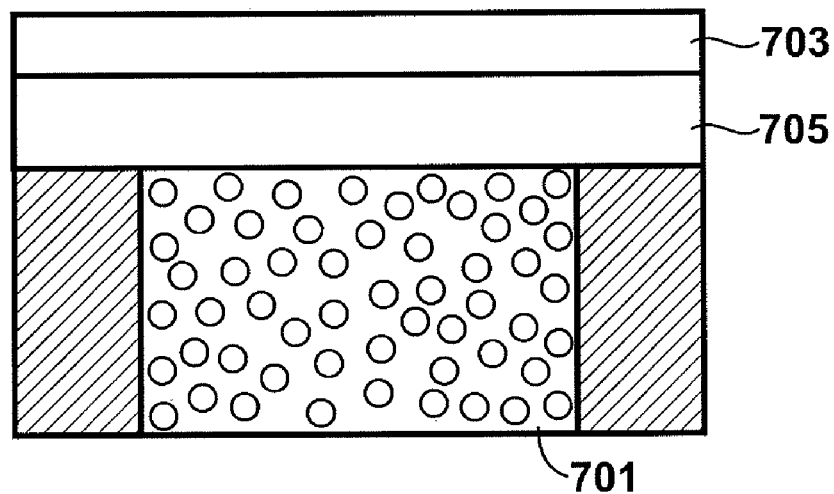
Figure 8:
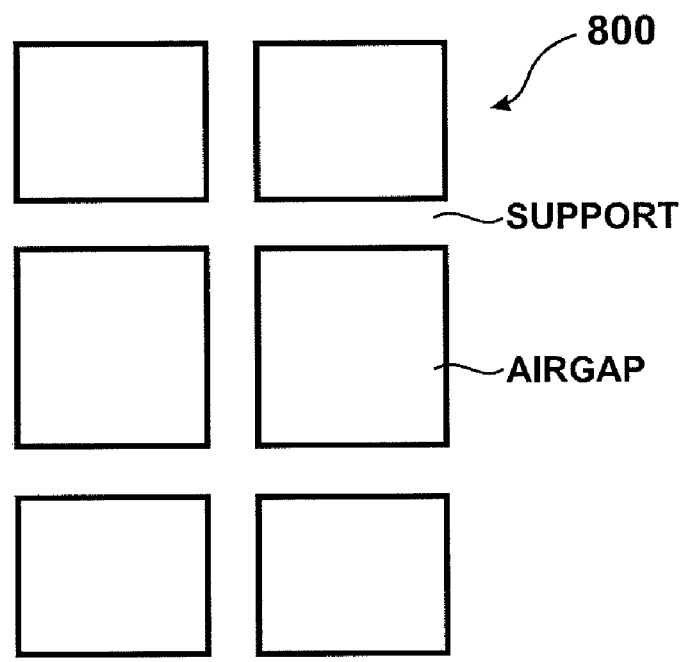

In certain embodiments, the method may fill openings (i.e., air gap) with a selected material to provide mechanical support and low k dielectric characteristics, as shown in FIG. 7. Here, particles such as silicon dioxide nanoparticles 701 can be deposited within the airgaps. These nanoparticles form a porous silicon dioxide network after oxidation in low temperature (i.e., less than 400 Degrees Celsius). The porous oxide can provide mechanical support and low k dielectric characteristics. The nanoparticles can be disposed between metal contacts, sacrificial layer, and stop layer regions. Of course, other types of fill materials and/or particles can also be used depending upon the application. As also shown, a passivation layer is formed overlying the metal layer. The passivation layer includes silicon dioxide 705 and silicon nitride 703, but can also be composed of other materials. The passivation layer protects and seals the interconnect structure, while leaving bonding pad structures exposed. Referring to FIG. 8, a top-view diagram 800 of a sacrificial oxide layer remaining for mechanical support is illustrated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a low K dielectric layer, the method comprising:
    providing a substrate;
    forming a layer of transistor elements overlying the substrate;
    forming a first interlayer dielectric layer overlying the layer of transistor elements;
    forming an etch stop layer overlying the first interlayer dielectric layer;
    patterning the first interlayer dielectric layer to form a contact structure;
    filling the contact structure with metallization;
    forming a thickness of sacrificial layer overlying the contact structure;
    forming a metal layer overlying the thickness of sacrificial layer, the metal layer being coupled to the contact structure;
    forming one or more other layers overlying the metal layer;
    selectively removing the thickness of sacrificial layer with a wet etching process while maintaining the metal layer and etch stop layer intact to form an air gap between a portion of the etch stop layer and the one or more other layers and maintaining a portion of the thickness of the sacrificial layer for mechanical support;
    forming a low K layer by providing low K material within a portion of the air gap; and
    forming a passivation layer overlying the metal layer.

2. The method of claim 1 wherein the thickness of sacrificial layer is TEOS.

3. The method of claim 1 wherein the metal layer comprises a copper bearing material.

4. The method of claim 1 wherein the thickness of sacrificial layer is a second interlayer dielectric layer, the second interlayer dielectric layer being selectively removed to form the air gap.

5. The method of claim 1 wherein the contact structure is a plug structure.

6. The method of claim 1 wherein the selectively removing is provided using an fluorine based gas.

* * * * *